United States Patent [19]
LaWhite

[11] Patent Number: 5,932,998
[45] Date of Patent: Aug. 3, 1999

[54] SYSTEM FOR DETERMINING FUNDAMENTAL FREQUENCY OF AN AC SIGNAL

[76] Inventor: Niels LaWhite, 438 Broadway, Somerville, Mass. 02145

[21] Appl. No.: 09/012,893

[22] Filed: Jan. 23, 1998

[51] Int. Cl.⁶ .................................................. G01R 23/02
[52] U.S. Cl. ..................... 324/76.42; 324/76.44; 324/76.46
[58] Field of Search ............................. 324/76.38, 76.42, 324/76.44, 76.45, 76.46, 76.47

[56] References Cited

U.S. PATENT DOCUMENTS

| | | | |
|---|---|---|---|
| 4,740,744 | 4/1988 | Lubarsky | 324/76.42 |
| 5,262,714 | 11/1993 | Friedman | 324/76.42 |
| 5,373,236 | 12/1994 | Tsui | 324/76.42 |

*Primary Examiner*—Josie Ballato
*Assistant Examiner*—Jose M. Solis
*Attorney, Agent, or Firm*—Brian M. Dingman

[57] ABSTRACT

A system for determining the fundamental frequency of a digitized AC signal is disclosed. Each signal zero crossing is detected, and in response to each zero crossing, two discrete impulses are generated. In response to the train of generated impulses, the system determines the fundamental frequency of the AC signal.

18 Claims, 10 Drawing Sheets

ANTI ALIASING FILTER, DOWN SAMPLER, AND DC REJECTION FILTER

IIR NOTCH FILTER

ZERO CROSSING INTERPOLATOR, IMPULSE PAIR GENERATOR FOR ONE PHASE

IIR AVERAGING FILTER

VARIABLE WIDTH AVERAGING FILTER

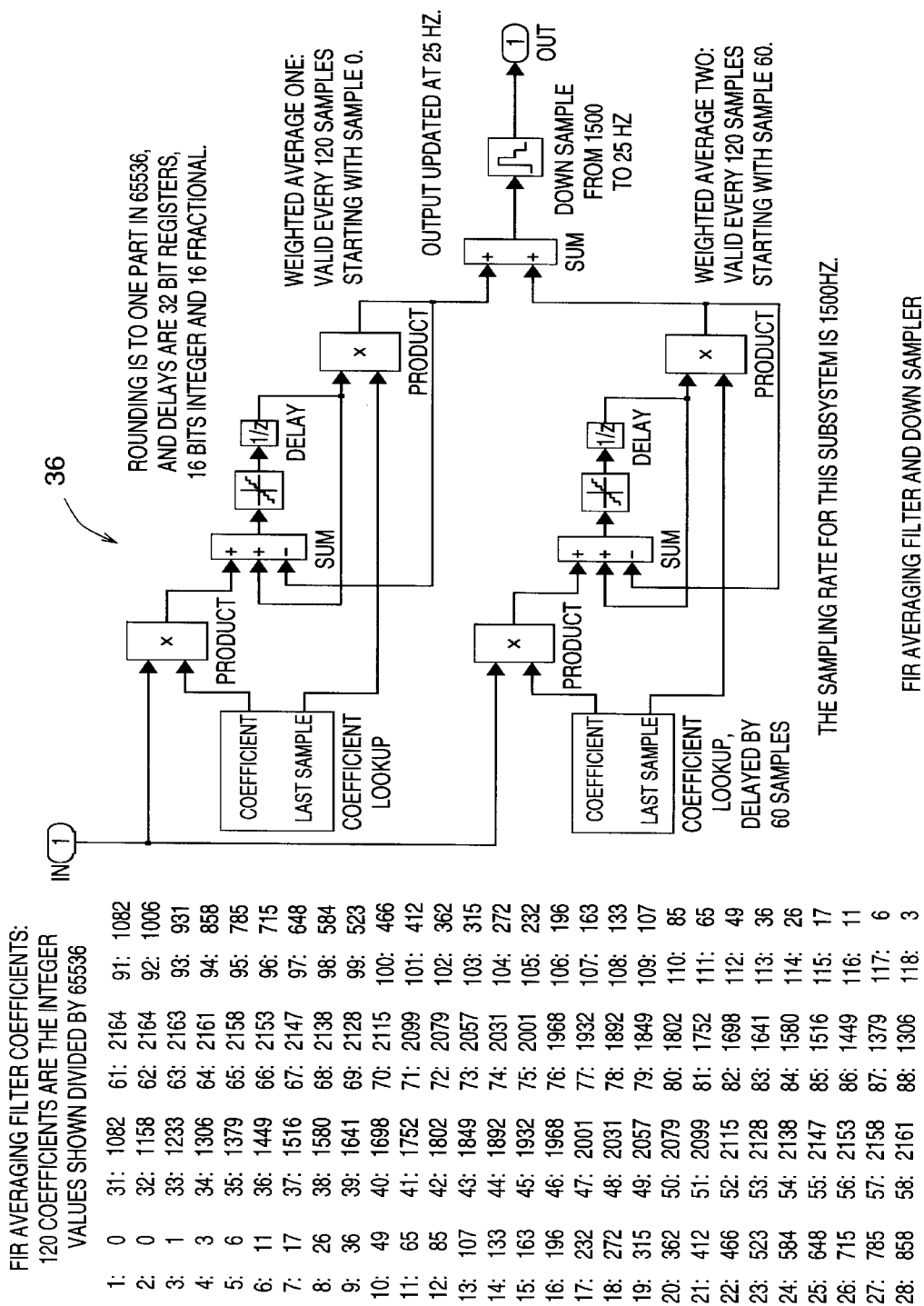

SUMMATION WITH
SIGNS AS INDICATED.

DOWN SAMPLES THE DATA
STREAM BY OUTPUTING ONLY
EVERY N SAMPLES. OTHER
SAMPLES ARE DISCARDED.
N MUST BE AN INTEGER.

MULTIPLICATION
OF TWO NUMBERS.

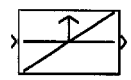

CROSSING DETECTOR

OUTPUTS A UNIT DISCRETE IMPULSE
EACH TIME THE INPUT CROSSES ZERO.

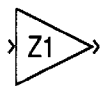

MULTIPLY BY CONSTANT VALUE.
CONSTANTS ARE ROUNDED TO
ONE PART IN 65536.

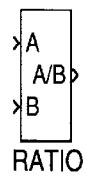

RATIO

OUTPUTS THE QUOTIENT A/B
OR ZERO IF B EQUALS ZERO.

ROUND TO INTEGER OR AS NOTED.

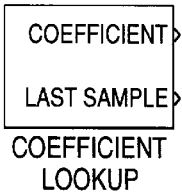

COEFFICIENT
LOOKUP

DELAY BY ONE SAMPLING INTERVAL
USING FIXED POINT MEMORY LOCATION.
PRECISION AS INDICATED, AND VALUES
BEYOND THE VALID RANGE ARE CLIPPED.

SEQUENTIALLY OUTPUTS COEFFICIENTS
FROM A TABLE, ONE PER SAMPLING INTERVAL.
THE 'LAST SAMPLE' OUTPUT IS ONE WHILE
ON THE LAST SAMPLE AND ZERO OTHERWISE.

KEY FOR SIMULATION DIAGRAMS

FIG. 11

SYSTEM FOR DETERMINING FUNDAMENTAL FREQUENCY OF AN AC SIGNAL

FIELD OF THE INVENTION

This invention relates to a system for determining the fundamental frequency of an AC signal.

BACKGROUND OF THE INVENTION

Frequency is a quality of AC signals which is measured for a variety of reasons. Companies involved with power generation and transmission need to know the fundamental frequency of the power, which in the United States should be 60 Hz. Frequency is not an instantaneous value. Thus, in order to determine frequency, information is required over some time period. A computed frequency value always represents the average frequency over some interval.

Generally, it is desirable to determine the fundamental frequency very quickly and accurately. Most frequency determination devices which are extremely accurate can take minutes to determine frequency. However, power producers and others involved in power distribution need virtually instantaneous frequency values (on the order of millisecond response times) in order to properly control the production and transmission of power having a known, stable fundamental frequency. The solution for such companies typically involves expensive equipment which has both the desired accuracy and response time. There thus exists the need for relatively inexpensive equipment which nonetheless accomplishes fast, accurate determination of the fundamental frequency of an AC signal having a known desired frequency.

SUMMARY OF THE INVENTION

It is therefore an object of this invention to provide a system for determining the fundamental frequency of an AC signal.

It is a further object of this invention to provide such a system which is relatively inexpensive, yet has an extremely fast response time.

It is a further object of this invention to provide such a system which is relatively inexpensive and is extremely accurate.

It is a further object of this invention to provide such a system which uses digital signal processing technology.

It is a further object of this invention to provide such a system which can be tuned to a desired accuracy.

It is a further object of this invention to provide such a system which can be tuned to a desired response time to changes in frequency.

This invention features a system for determining the fundamental frequency of a digitized AC signal which periodically crosses zero voltage at zero crossings, at which it changes from positive to negative, or vice versa, comprising:

means for detecting AC signal zero crossings;
means, responsive to said means for detecting, for generating a plurality of discrete impulses for each detected zero crossing; and
means, responsive to said means for generating, for determining the fundamental frequency of the AC signal.

The means for detecting may include crossing detector means for generating a discrete non-zero value at each AC signal zero crossing. The means for generating a plurality of discrete impulses may generate two discrete non-zero values at each AC signal zero crossing, and the sum of said two discrete non-zero values may be a constant. The means for detecting may include means for periodically sampling the AC signal voltage, and the sampling frequency of said means for periodically sampling may be much greater than the fundamental frequency of the AC signal. In one embodiment, the fundamental frequency of the AC signal is about 60 Hz, and said sampling frequency is 1500 Hz.

The means for detecting may further include crossing detector means, responsive to said means for periodically sampling, for generating a discrete non-zero value at each periodic sample indicative of each AC signal zero crossing, and the crossing detector means includes means for generating a discrete zero value at each periodic sample not indicative of an AC signal zero crossing. The constant may be equal to one-half of said sampling frequency.

The system may further include notch filter means for filtering the AC signal before it reaches said means for detecting, said notch filter means having an essentially flat response around the AC signal fundamental frequency, and essentially zero response around at least one harmonic of the AC signal fundamental frequency. The system may further include anti-aliasing filter means for filtering the AC signal before said notch filter means.

The means for determining the fundamental frequency of the AC signal may include means for filtering said plurality of discrete impulses, said means for filtering having an essentially flat response around zero Hz, and essentially zero response around at least one harmonic of the AC signal fundamental frequency. The means for filtering said plurality of discrete impulse may include IIR (Infinite Impulse Response) averaging filter means which takes in said discrete impulses, and creates a filtered output. The means for filtering said plurality of discrete impulses may further include variable width averaging filter means which takes in the output of said IIR averaging filter means, and creates a filtered output. The variable width averaging filter means may include means for adjusting the speed of response of said means for determining the fundamental frequency of the AC signal, to changes in the fundamental frequency. The means for filtering said plurality of discrete impulses may further include FIR (Finite Impulse Response) averaging filter means which takes in the output of said variable width averaging filter means, and creates a filtered output.

In a more specific embodiment, this invention features a system for determining the fundamental frequency of a digitized three-phase AC signal periodically crosses zero voltage at zero crossings, at which it changes from positive to negative, or vice versa, comprising:

first means for detecting zero crossings of one phase of the AC signal;
second means for detecting zero crossings of a second phase of the AC signal;
third means for detecting zero crossings of a third phase of the AC signals;
means, responsive to said first means for detecting, for generating a plurality of discrete impulses for each detected zero crossing of the one phase of the AC signal;
means, responsive to said second means for detecting, for generating a plurality of discrete impulses for each detected zero crossing of the second phase of the AC signal;
means, responsive to said third means for detecting, for generating a plurality of discrete impulses for each detected zero crossing of the third phase of the AC signal;

means for summing said generated plurality of discrete impulses from all of said means for generating; and means, responsive to said means for summing, for determining the fundamental frequency of the AC signal. The means for summing may include means for subtracting from the summed discrete impulses a signal related to a presumed fundamental frequency, so that said means for determining the fundamental frequency of the AC signal resolves the difference between the presumed fundamental frequency and the actual fundamental frequency.

BRIEF DESCRIPTION OF THE DRAWINGS

Other objects, features and advantages will occur to those skilled in the art from the following description of the preferred embodiment, and accompanying drawings, in which;

FIG. 10A is a detailed schematic diagram of the FIR averaging filter and down sampler of the system of FIG. 2;

FIG. 10B is a chart of the coefficients used in the FIR averaging filter of FIG. 10A; and FIG. 11 is a key describing various elements of the previous figures.

DESCRIPTION OF THE PREFERRED EMBODIMENT

This invention may be accomplished in a system for determining the fundamental frequency of a digitized AC signal which periodically crosses zero voltage at times termed "zero crossings", at which the voltage changes from positive to negative, or vice versa. There are two zero crossings for each cycle of an AC signal. The system of this invention detects the AC signal zero crossings from the digitized AC signal voltage values. In response, a plurality of discrete impulses are generated for each detected zero crossing. From these impulses, the fundamental frequency of the AC signal is determined.

The system of this invention assumes the existence of a digitized AC signal. These digitized values may be created by an A/D converter. The output of the A/D converter would then be the input to the system of this invention. In the preferred embodiment described herein, the system of this invention is accomplished entirely in software. The system accomplishes a relatively inexpensive digital signal processing solution for fast and accurate determination of the fundamental frequency of an AC signal. The preferred embodiment includes a parameter to control the trade-off between accuracy and time response of the system of this invention, in order to optimize the system to a particular customer application.

Figure 1:
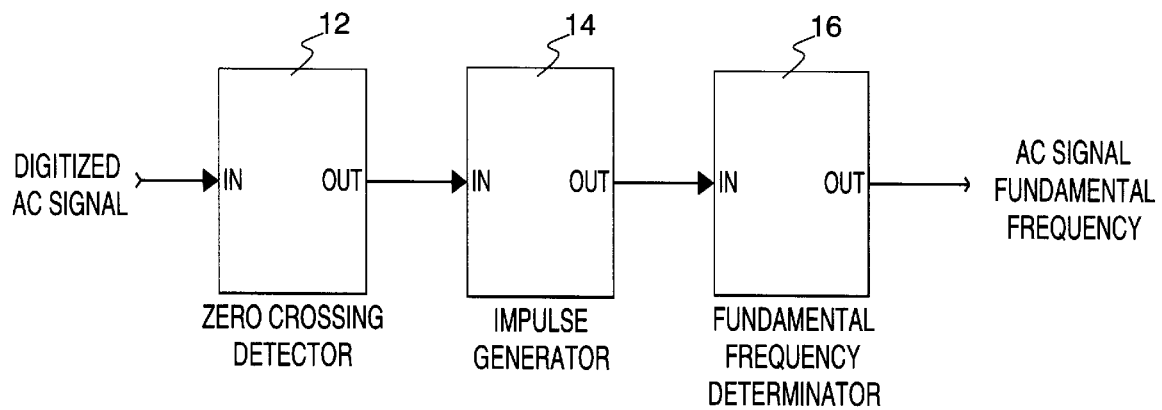
FIG. 1 is a simplified block diagram of a system for determining the fundamental frequency of a digitized AC signal according to this invention.

The system of this invention is shown in a simplified block diagram form in FIG. 1. System 10 determines the fundamental frequency of a digitized AC signal which is input to the system. Zero crossing detector 12 detects AC signal zero crossings by interrogating the digitized AC signal. Impulse generator 14 is responsive to zero crossing detector 12, and generates a plurality of discrete impulses for each detected zero crossing. Fundamental frequency determinator 16 is responsive to impulse generator 14, and determines the fundamental frequency of the AC signal.

Figure 2:
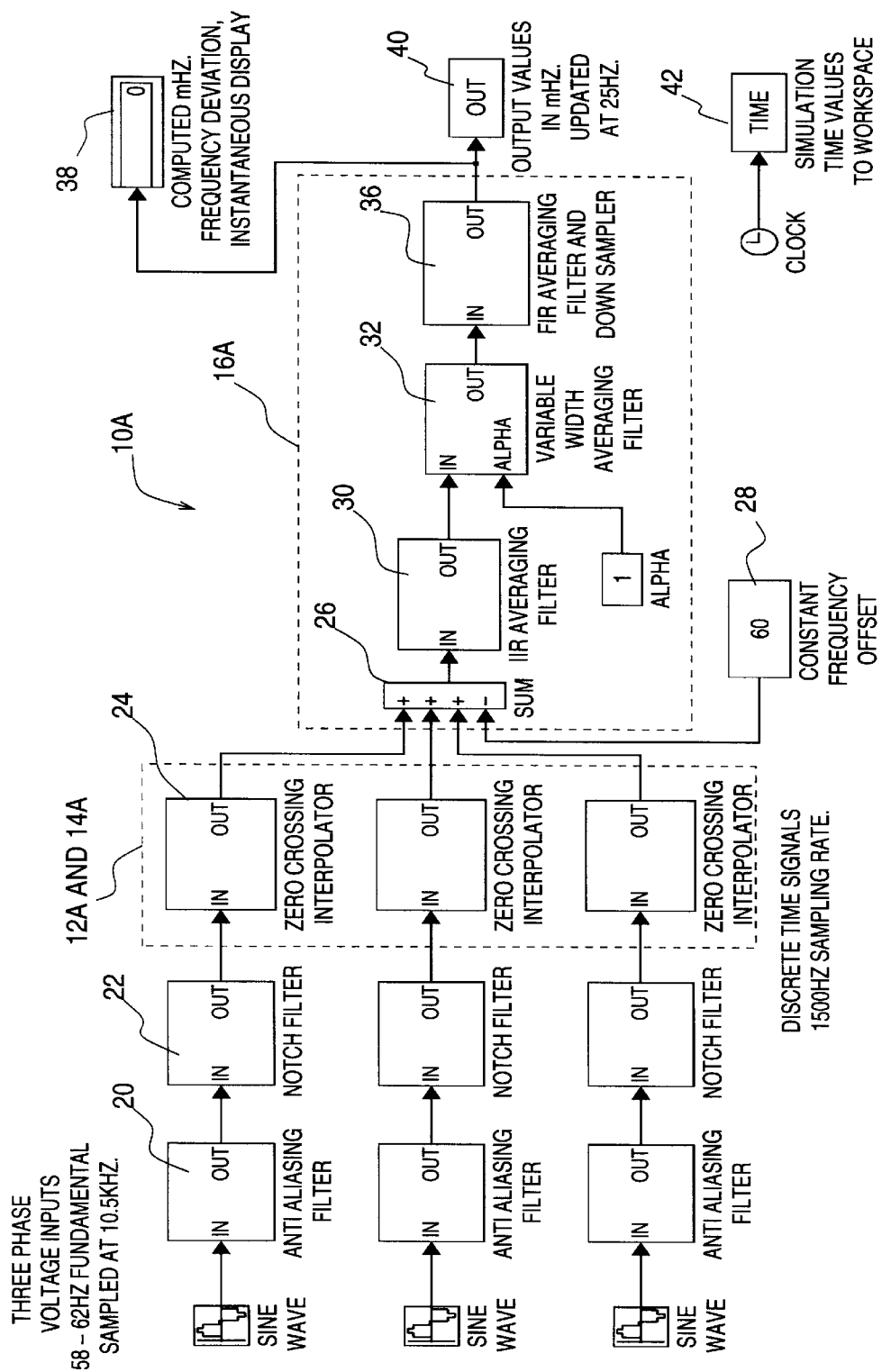
FIG. 2 is a block diagram of the preferred embodiment of the system for determining fundamental frequency according to this invention.

A more detailed conceptual block diagram of the preferred embodiment of the system of this invention is shown in FIG. 2. A key describing the function of various blocks of the block diagrams is set forth in FIG. 11. FIG. 2 details a system which determines the fundamental frequency of a three phase AC signal which has been digitized before it is input to system 10a, FIG. 2. System 10a will be described as determining the fundamental frequency of a nominally 60 Hz signal such as exists in the power grid in the United States. System 10a is optimized based at least in part on the following assumptions: the frequency of interest is the fundamental frequency, which is close to 60 Hz; the three-phase voltage wave form has roughly constant amplitude, which modulates slowly compared to the fundamental frequency; the three individual phases are roughly balanced and have a fundamental phase relationship of approximately 120 degrees; and distortion present in the wave form causes frequency components at and around frequencies which are multiples of the fundamental frequency, but there is no significant signal at all other frequencies.

System 10a, FIG. 2, includes three parallel legs, one for each phase input, each such leg including anti-aliasing filter 20, notch filter 22, and zero crossing interpolator 24. Anti-aliasing filter 20 and notch filter 22 together strip out high frequency noise, harmonic distortion, and DC and extremely low frequency signals present in the three input wave forms, and also down sample the input signal by a factor of 7. Each signal output from a notch filter 22 is a relatively pure digitized sinusoid effectively containing only the fundamental frequency component. The pass-band width of the notch filter 22 is from 55 to 65 Hz, which is sufficient to allow the filtered fundamental signals to modulate and change frequency. The digitized sine waves input to anti-aliasing filter 20 have been sampled at 10.5 KHz. After down sampling, the sampling rate of the fundamental signal is 1500 Hz, which is roughly 25 samples per fundamental cycle at a nominal 60 Hz.

Figure 3:
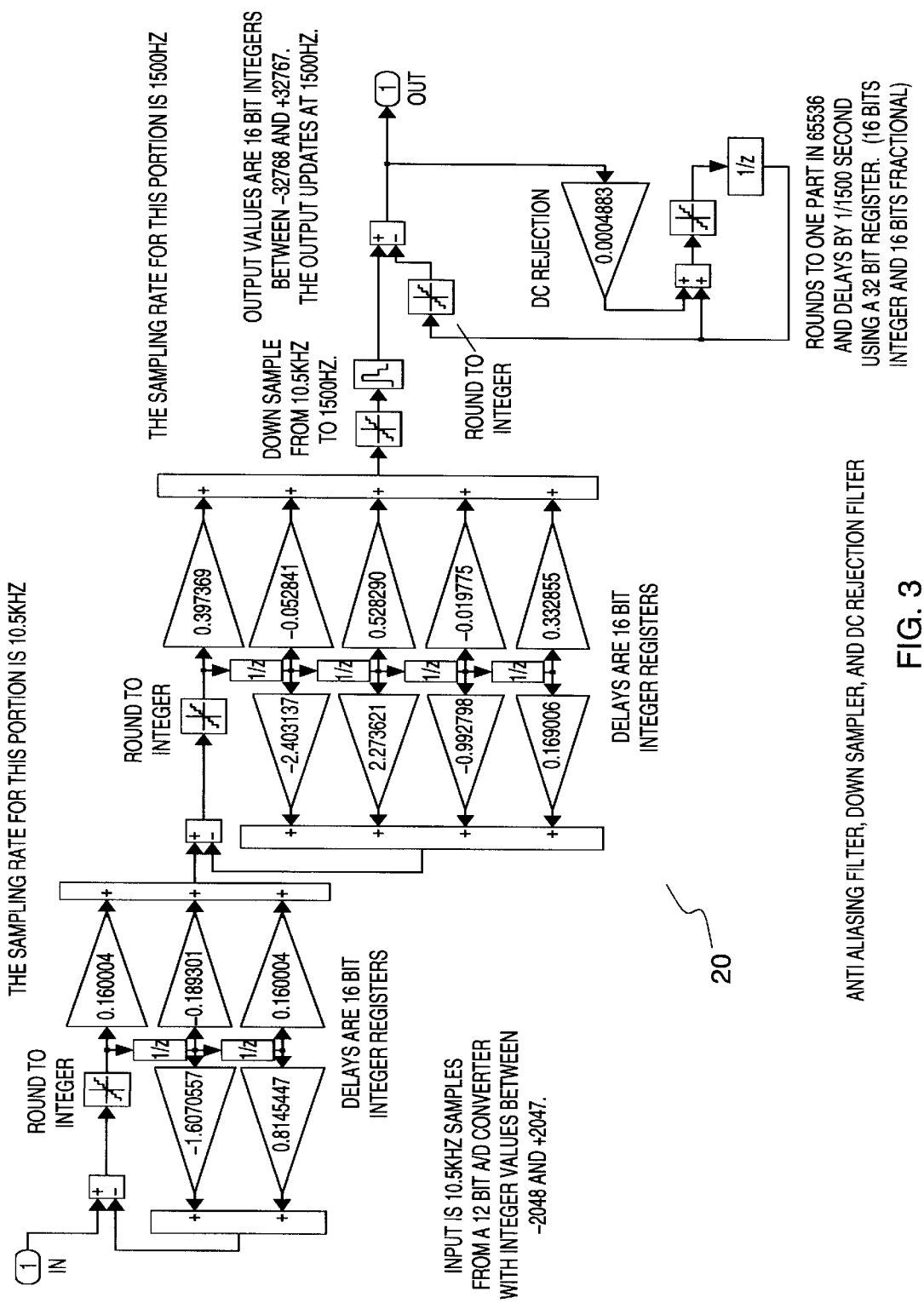
FIG. 3 is a detailed schematic diagram of the anti-aliasing filter of the system of FIG. 2.

Anti-aliasing filter 20 is shown in detail in FIG. 3. Filter 20 accomplishes down sampling by a factor of 7, while also acting as an anti-aliasing filter and a DC rejection filter.

Figure 4:
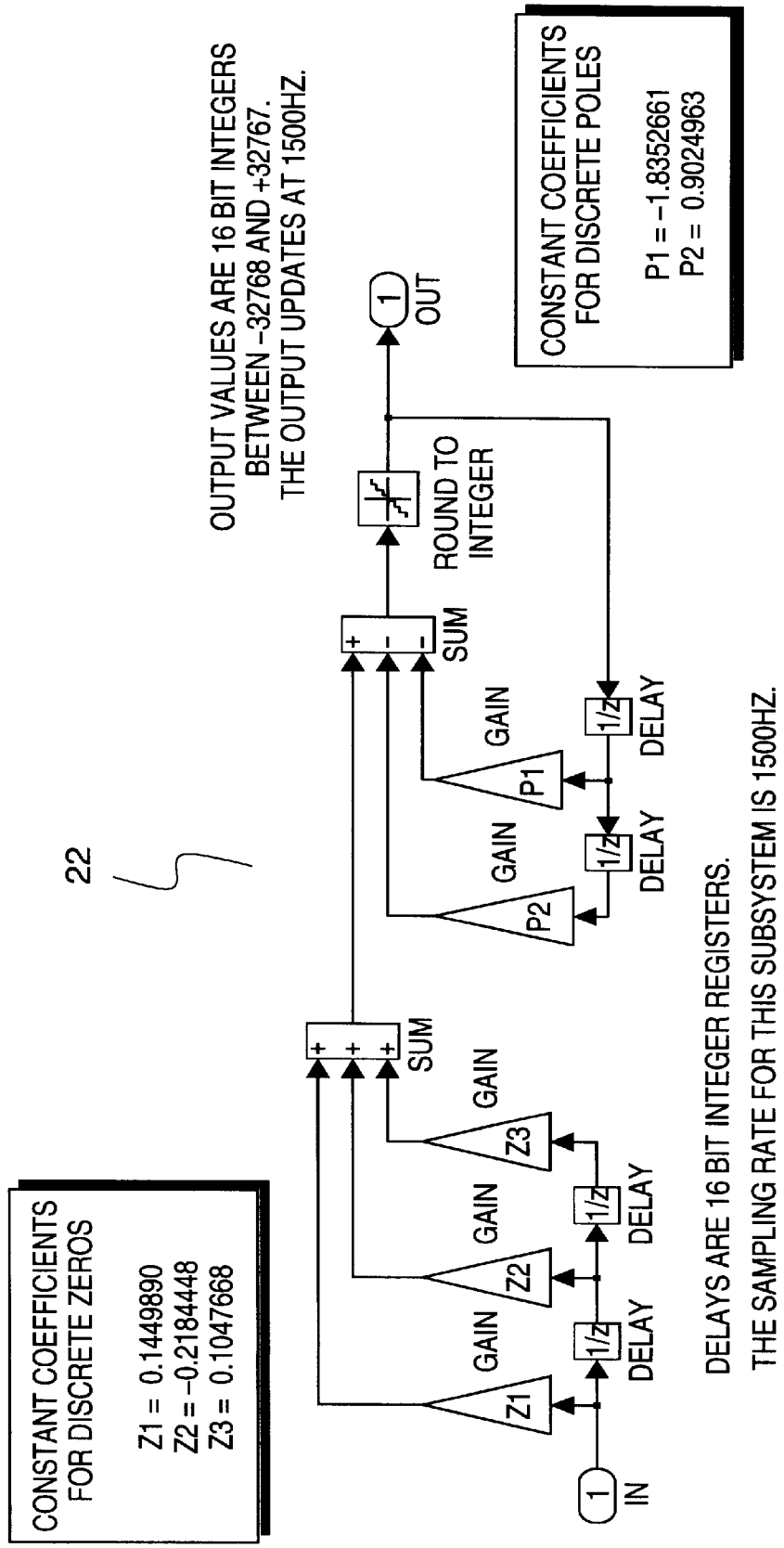
FIG. 4 is a detailed schematic diagram of the notch filter of FIG. 2.

Notch filter 22 is shown in detail in FIG. 4. Notch filter 22 is an IIR filter with 3 discrete zeros with coefficients Z1–Z3 and 2 discrete poles with coefficients P1 and P2. The combination of the filters shown in FIG. 3 and FIG. 4 create a filter with a flat response between 55 and 65 Hz, and essentially zero below 10 Hz and between 110 Hz and 750 Hz. The accuracy of the frequency determination of the system of this invention is improved by sampling the input wave forms at 10.5 KHz but then down sampling to a 1500 Hz sampling rate for the zero crossing interpolator. In combination with the anti-aliasing and notch filters, this results in accurate sampling at a fast time response with a relatively small amount of computation, so that the system of this invention can be accomplished with a single DSP chip, such as the ADSP 2105 DSP from Analog Devices. This chip is initialized once by an external ROM after power is applied.

Figure 5:
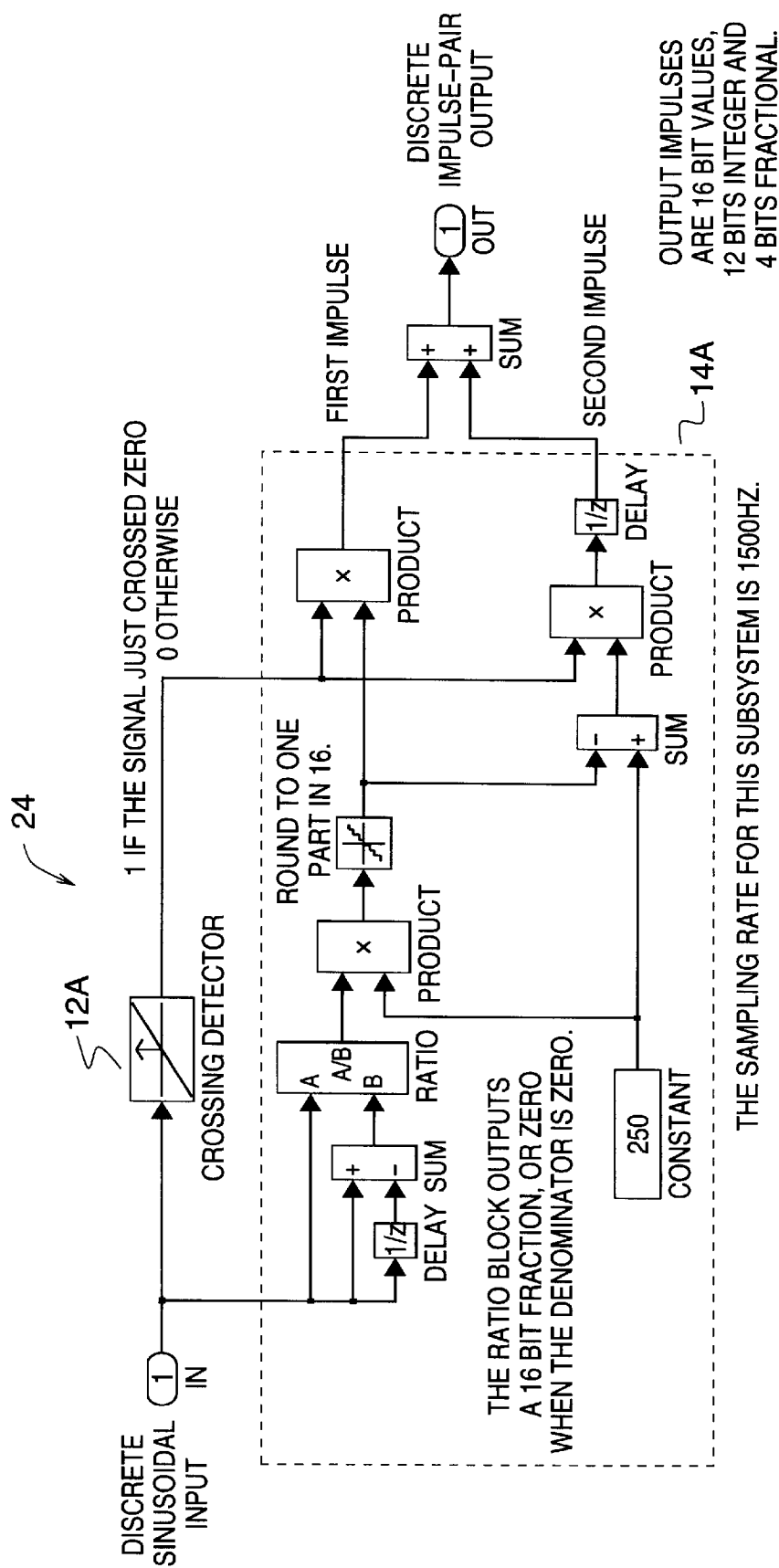
FIG. 5 is a detailed schematic diagram of the zero crossing interpolator of FIG. 2.

Zero crossing interpolator 24 is shown in detail in FIG. 5. This accomplishes both the zero crossing detector 12 and impulse generator 14 of FIG. 1. The input to zero crossing interpolator 24 is a discrete sinusoid at 1500 Hz. Crossing detector 12a outputs a discrete value (a"1") whenever the signal has just crossed zero. This is determined by looking for a change in sign of the voltage value of the input signal. At each other input, crossing detector 12a outputs a discrete "0" value.

Impulse generator 14a has as inputs both the output of crossing detector 12a and the input to crossing detector 12a. Impulse generator 14a generates two discrete impulses for each detected zero crossing. The sum of the values of each such pair of discrete impulses is a constant value, which is selected as 250 for the system of FIG. 2. The 250 value is the sampling rate (1500) divided by the number of impulse pairs per fundamental cycle (six, or two each times three phases). The relative magnitudes of the two discrete impulses of each impulse pair is determined by interpolation (assuming that the voltage path is a straight line between the two samples around a zero crossing), as set forth in impulse generator 14a, FIG. 5. In mathematical terms, the value of each discrete impulse is determined as follows:

If $V_i$ is the voltage of the discrete input just before the zero crossing, and $V_{i+1}$ the voltage of the input just after the zero crossing, and K is the constant sum of the pair of generated impulses, the value of the first impulse is: $K(V_{i+1}/(V_{i+1}-V))$ and the second impulse is K minus the value of the first impulse.

The generation of a pair of discrete impulses allows the centroids of the impulse pairs to be spaced evenly in time, as are the actual zero crossings of the input AC signal (presuming that the frequency is constant). This is despite the fact that the discrete sampling rate is not an exact multiple of the fundamental frequency being measured. This even spacing of the impulse pair centroids cause the undesired frequency components to be almost entirely restricted to multiples of the actual fundamental frequency, which allows the downstream filter to be specifically designed to reject frequencies close to multiples of the 60 Hz fundamental frequency. In contrast, if only a single impulse was generated for each zero crossing, the impulse train would have either 5 or 6 zero samples (assuming a 1500 Hz sample rate and a 60 Hz fundamental frequency) between each generated impulse, which would be much more difficult to filter because the undesired frequency components would not be restricted to multiples of the actual fundamental frequency. Thus, the generation of two discrete impulses which total to a constant value, allows an accurate frequency determination with fast response time using a simple and inexpensive digital signal processor.

Figure 6A:
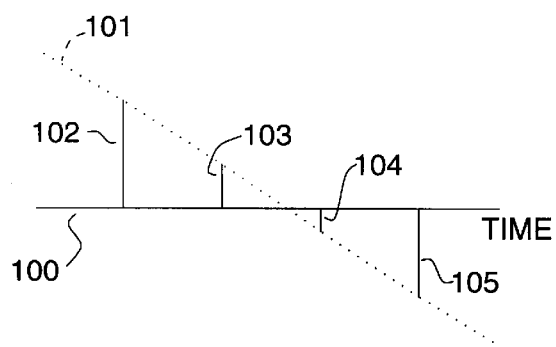
FIG. 6A is a conceptual plot of a portion of an AC signal, illustrating a zero crossing, and the digitized sampling used in the invention.
Figure 6B:
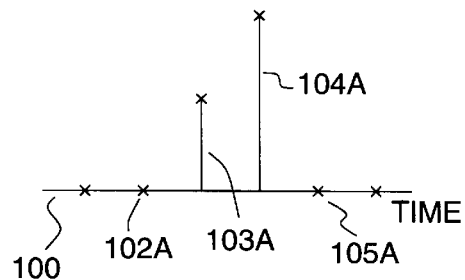
FIG. 6B is a representation of a series of impulses, including the two impulses generated by the impulse generator of FIG. 5 resulting from the zero crossing shown in FIG. 6A.

FIGS. 6A and 6B are helpful in understanding the impulse pair generation and interpolation accomplished by zero crossing interpolator 24, FIG. 5. FIG. 6A shows a portion of the trace 101 of an AC signal as it crosses zero voltage line 100. Discrete voltage samples 102–105 are representative of the actual inputs to zero crossing interpolator 24, FIG. 5. A zero crossing is detected by crossing detector 12a because sample 104 has a negative value, and follows positively valued sample 103. The corresponding output of zero crossing interpolator 24 is shown in FIG. 6B. A series of zero values such as zero values 102a and 105a are output for inputs which are not indicative of a zero crossing. Impulse pair 103a and 104a are generated by impulse generator 14a in response to the zero crossing occurring between samples 103 and 104. In actuality, impulse pair 103a and 104a would be delayed by one sampling interval, because the zero is not detected until sample 104. However, this is inconsequential. The values of impulses 103a and 104a are determined by interpolation as described above, and in this embodiment add to the constant value 250.

Figure 7:
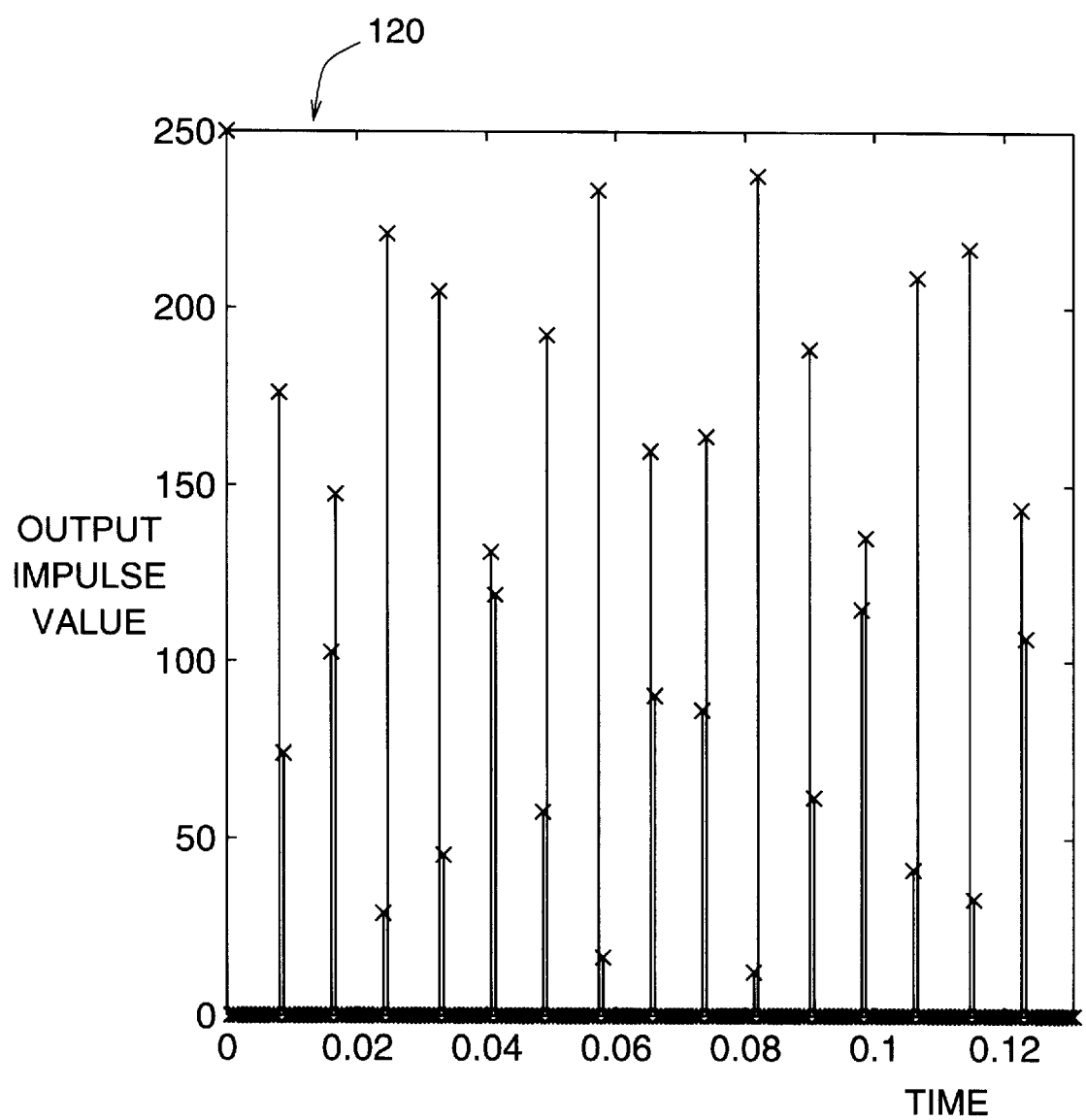
FIG. 7 is a plot of the impulses generated by the impulse generator of FIG. 5 over the course of about 0.13 seconds for an AC signal having a fundamental frequency of 60 Hz.

FIG. 7 is a chart similar to that of FIG. 6B, but detailing impulse pairs for a sample of about 0.13 seconds in duration of one phase of a nominal three phase 60 Hz input signal, with an X denoting each output of zero crossing interpolator 24, FIG. 5. As can be seen, each pair of non-zero impulses adds to the constant value 250. There are a number of "0" value outputs between each non-zero pair.

System 10a, FIG. 2, actually generates three separate streams of impulses such as shown in FIG. 7, nominally shifted in phase by 120 degrees from one another. These three impulse trains are summed in summer 26. Constant frequency offset 28 is subtracted so that system 10a has as an output a computed frequency deviation from the nominal fundamental frequency of 60 Hz, rather than the actual fundamental frequency. Since the nominal frequency is known, this can be done. This summing of the three impulse pair trains creates a single discrete time signal which is averaged and filtered downstream. Because the three input wave forms from the three zero crossing interpolators are roughly balanced, the 120 degree phase relationship between the fundamental wave forms means that the impulse pairs will interleave and yield a single signal with three times as many evenly spaced impulse pairs. With a pair of impulses for each zero crossing, two crossings per phase per cycle, and three phases, this system creates approximately 12 non-zero values out of the approximately 25 samples of any given cycle, again assuming a nominal 60 Hz signal and 1500 Hz sample frequency. The introduction of the constant offset is accomplished such that the average value is exactly zero when the input is exactly 60 Hz. Thus, the frequency computation is that of deviation from 60 Hz, as opposed to absolute. This reduces the dynamic range requirements of the downstream filtering stages by a factor of 10, assuming that the system is calculating the deviation of +/−3 Hz as opposed to an absolute reading of 60+/−3 Hz.

Figure 8:
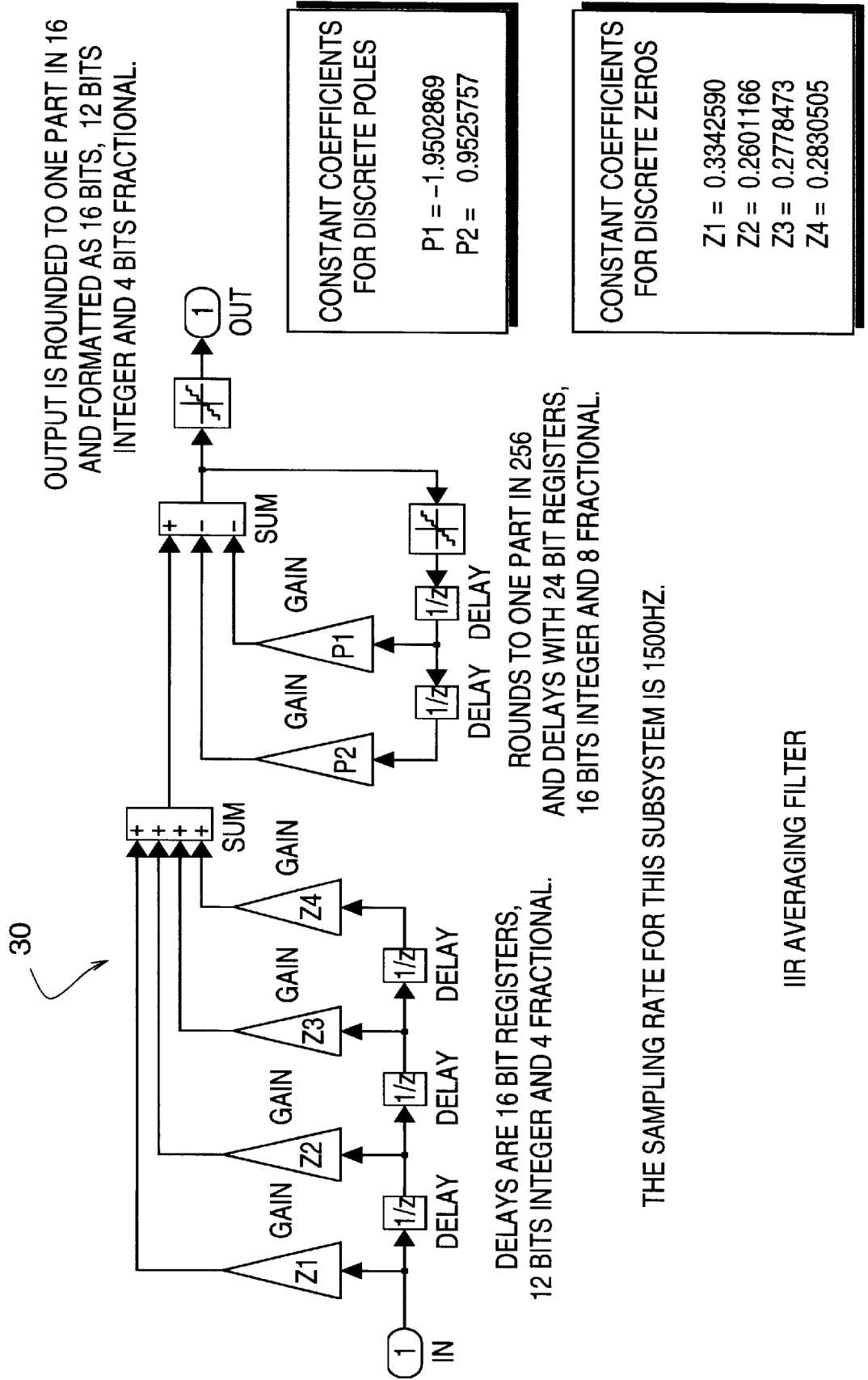
FIG. 8 is a detailed schematic diagram of the IIR averaging filter of the system of FIG. 2.

IIR averaging filter 30 is shown in detail in FIG. 8. Filter 30 includes three discrete zeros with coefficients Z1–Z4, and 2 discrete poles with coefficients P1 and P2. Filter 30 has poles and zeros that amplify and reject the desirable and undesirable frequency components of the frequency deviation signal. As the signal is dominated by a 6 per cycle pair train, the two zeros are used to reject frequencies near 360 Hz. To emphasize the desired averaging interval, the two poles are placed to give flat low-frequency gain up to the desired band width.

Figure 9:
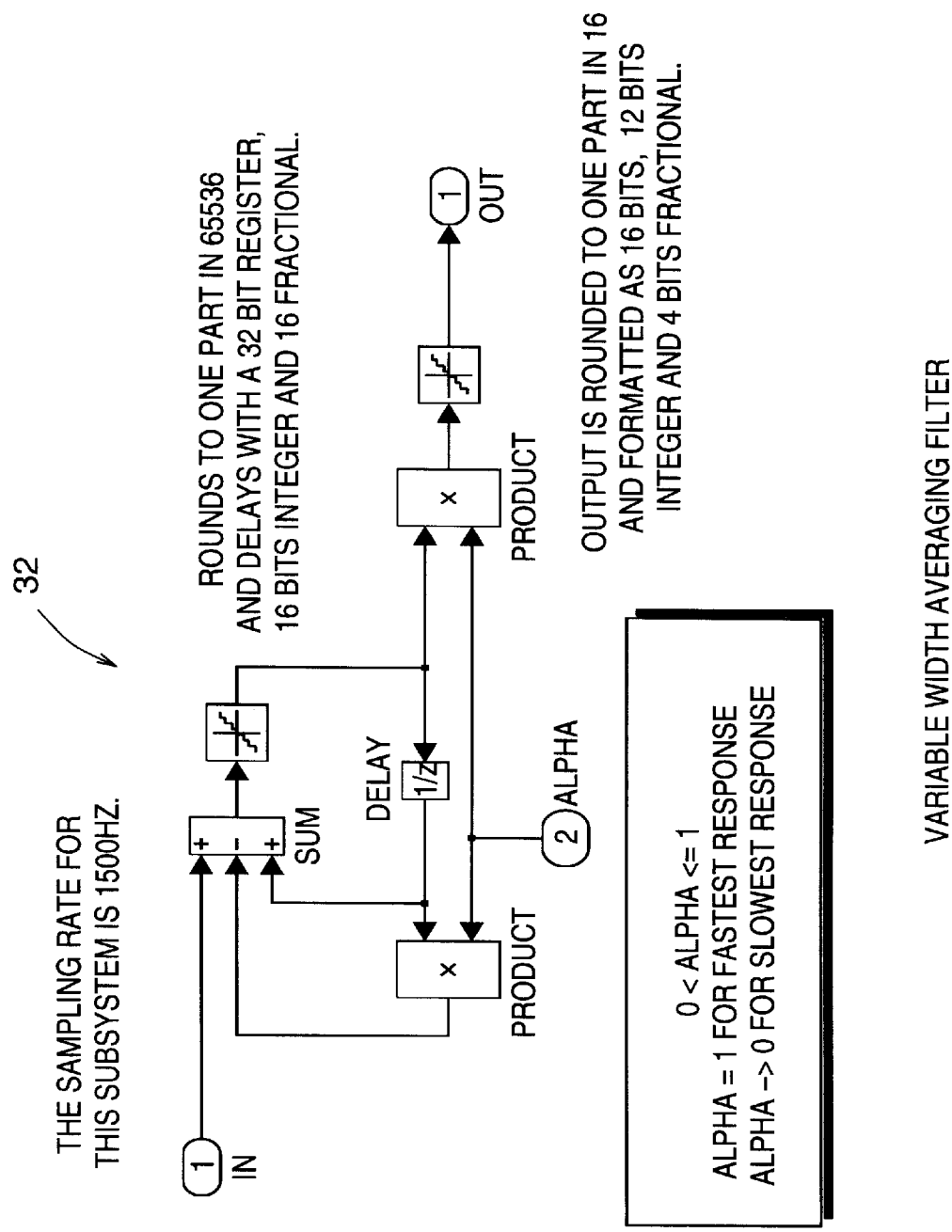
FIG. 9 is a detailed schematic diagram of the variable width averaging filter of the system of FIG. 2.

Variable width averaging filter 32, FIG. 9, includes a variable called "alpha", which may be made user selectable, which selectively decreases the band width. Using the value "1" for alpha provides performance with maximum bandwidth, and reducing alpha increases accuracy by providing a longer averaging interval. For example, reducing alpha from one to 0.003 increases accuracy to about +/−0.1 MilliHz, while increasing settling time to about 2.5 seconds. The effect of this is to allow the selection of a particular point on a system time response-accuracy curve, depending on a particular application.

FIR averaging filter and down sampler 36 is shown in FIG. 10A, with a chart of filter coefficients detailed in FIG. 10B. Filter 36 performs the final optimized filtering of the frequency deviation signal. The filter computes each of the 25 Hz output values as a weighted sum of the last 120 samples of the 1500 frequency deviation signal. Two of such 120 length weighted averages are interleaved, so that the resulting output frequency is 25 Hz. The weightings used in the average are designed to provide a frequency response as follows: small bands near multiples of 60 Hz are rejected, while the low frequency response is as flat as possible. The result is accurate to about 0.001 Hz and has a settling time of about 0.32 seconds. The total DC gain of IIR averaging filter 30, variable width averaging filter 32, and FIR averaging filter 36 is 1000, so while the impulse pair train has an average value in Hertz, the computed average has the units of milli Hertz.

Other embodiments will occur to those skilled in the art and are within the following claims:

What is claimed is:

1. A system for determining the fundamental frequency of a digitized three-phase AC signal, in which each phase periodically crosses zero voltage at zero crossings, at which it changes from positive to negative, or vice versa, the system comprising:

first means for detecting zero crossings of one phase of the AC signal;

second means for detecting zero crossings of a second phase of the AC signal;

third means for detecting zero crossings of a third phase of the AC signal;

means, responsive to said first means for detecting, for generating a plurality of discrete impulses for each detected zero crossing of the one phase of the AC signal;

means, responsive to said second means for detecting, for generating a plurality of discrete impulses for each detected zero crossing of the second phase of the AC signal;

means, responsive to said third means for detecting, for generating a plurality of discrete impulses for each detected zero crossing of the third phase of the AC signal;

means for summing said generated plurality of discrete impulses from all of said means for generating; and means, responsive to said means for summing, for determining the fundamental frequency of the AC signal.

2. The fundamental frequency determination system of claim 1 in which each said means for detecting includes crossing detector means for generating a discrete non-zero value at each AC signal zero crossing.

3. The fundamental frequency determination system of claim 1 in which each said means for generating a plurality of discrete impulses generates two discrete non-zero impluses at each AC signal zero crossing.

4. The fundamental frequency determination system of claim 3 in which the sum of said two discrete non-zero impluses is a constant.

5. The fundamental frequency determination system of claim 4 in which each said means for detecting includes means for periodically sampling the AC signal voltage.

6. The fundamental frequency determination system of claim 5 in which the sampling frequency of said means for periodically sampling is much greater than the fundamental frequency of the AC signal.

7. The fundamental frequency determination system of claim 6 in which the fundamental frequency of the AC signal is about 60 Hz, and said sampling frequency is 1500 Hz.

8. The fundamental frequency determination system of claim 6 in which each said means for detecting further includes crossing detector means, responsive to said means for periodically sampling, for generating a discrete non-zero value at each periodic sample indicative of each AC signal zero crossing.

9. The fundamental frequency determination system of claim 8 in which each said crossing detector means includes means for generating a discrete zero value at each periodic sample not indicative of an AC signal zero crossing.

10. The fundamental frequency determination system of claim 1 further including notch filter means for filtering each phase of the AC signal before it reaches each said means for detecting, said notch filter means having an essentially flat response around the AC signal fundamental frequency, and essentially zero response around at least one harmonic of the AC signal fundamental frequency.

11. The fundamental frequency determination system of claim 10 further including anti-aliasing filter means for filtering each phase of the AC signal before said notch filter means.

12. The fundamental frequency determination system of claim 6 in which said constant is equal to one-half of said sampling frequency.

13. The fundamental frequency determination system of claim 1 in which said means for determining the fundamental frequency of the AC signal includes means for filtering said plurality of discrete impulses, said means for filtering having an essentially flat response around zero Hz, and essentially zero response around at least one harmonic of the AC signal fundamental frequency.

14. The fundamental frequency determination system of claim 13 in which said means for filtering said plurality of discrete impulse includes IIR averaging filter means which takes in said discrete impulses, and creates a filtered output.

15. The fundamental frequency determination system of claim 14 in which said means for filtering said plurality of discrete impulses further includes variable width averaging filter means which takes in the output of said IIR averaging filter means, and creates a filtered output.

16. The fundamental frequency determination system of claim 15 in which said variable width averaging filter means includes means for adjusting the speed of response of said means for determining the fundamental frequency of the AC signal, to changes in the fundamental frequency.

17. The fundamental frequency determination system of claim 15 in which said means for filtering said plurality of discrete impulses further includes FIR averaging filter means which takes in the output of said variable width averaging filter means, and creates a filtered output.

18. The fundamental frequency determination system of claim 1 in which said means for summing includes means for subtracting from the summed discrete impulses a signal related to a presumed fundamental frequency, so that said means for determining the fundamental frequency of the AC signal resolves the difference between the presumed fundamental frequency and the actual fundamental frequency.

* * * * *